(12) United States Patent
Hojabri

(10) Patent No.: US 6,593,804 B1
(45) Date of Patent: Jul. 15, 2003

(54) CONTROLLABLE HIGH FREQUENCY EMPHASIS CIRCUIT FOR SELECTIVE SIGNAL PEAKING

(75) Inventor: Peyman Hojabri, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/196,618

(22) Filed: Jul. 16, 2002

Related U.S. Application Data

(63) Continuation of application No. 10/179,071, filed on Jun. 25, 2002.

(51) Int. Cl.$^7$ ................................................ H03B 19/00
(52) U.S. Cl. ........................ 327/559; 327/121; 327/559
(58) Field of Search ................................ 327/554, 558, 327/559, 113, 355, 121

(56) References Cited

U.S. PATENT DOCUMENTS

| | | | | |
|---|---|---|---|---|
| 3,857,104 A | * | 12/1974 | Sacks | 327/552 |
| 5,172,218 A | * | 12/1992 | Wilkinson | 375/240.01 |
| 5,235,223 A | * | 8/1993 | Maple | 327/556 |
| 5,565,812 A | * | 10/1996 | Soenen | 327/558 |
| 5,798,670 A | * | 8/1998 | Lee | 327/552 |
| 5,909,414 A | * | 6/1999 | Ohta | 369/44.33 |
| 6,118,332 A | * | 9/2000 | Jabs | 327/553 |

* cited by examiner

*Primary Examiner*—Terry D. Cunningham
(74) *Attorney, Agent, or Firm*—Wilman Harrold Allen & Dixon

(57) ABSTRACT

A signal peaking circuit for selectively emphasizing, or boosting, the higher frequencies of an incoming signal. A frequency emphasis circuit with an overall high pass transfer characteristic selectively emphasizes higher frequency signal components over lower frequency signal components. The transfer characteristic is selectively variable to allow the number and peak values of the emphasized signal components to be selectively variable.

20 Claims, 7 Drawing Sheets

CONTROLLABLE HIGH FREQUENCY EMPHASIS CIRCUIT FOR SELECTIVE SIGNAL PEAKING

CROSS REFERENCE TO RELATED APPLICATION

This application is a continuation of U.S. Pat. No. 10/179,071 filed Jun. 25, 2002.

BACKGROUND OF THE INVENTION

1. Field of the Invention

The present invention relates to frequency selective circuits, and in particular, to frequency selective circuits used for emphasizing higher frequency signal components of a signal for purposes of peaking selective ranges of signal frequencies.

2. Description of the Related Art

In many signal processing applications it is desirable to provide high frequency compensation in the form of emphasizing higher frequency signal components over lower signal components. For example, one of many such applications includes circuits used for processing video display information, such as text and images. In such applications, it is often desirable to add high frequency signal emphasis so as to cause the video information to appear more visually sharp on the display device (e.g., cathode ray tube or liquid crystal display).

For television signal applications, such signal emphasis or boosting, is often introduced at a frequency approximating that of the chrominance signal carrier of the television signal, the absolute frequency of which will vary according to the television signal standard in use. With the increased use of high definition televisions and personal computers for displaying such images, the displays of such images must occur at higher frequencies due to the increased horizontal scan rates of such devices.

Accordingly, with a potentially large number of applications available for such a circuit, in terms of needing to provide high frequency signal emphasis at a number of various frequencies, it would be desirable to make such high frequency emphasis adjustable so that the user can alter the emphasis to accommodate the scan rate of the display device.

SUMMARY OF THE INVENTION

A signal peaking circuit in accordance with the presently claimed invention selectively emphasizes the higher frequency signal components of an incoming signal. Control circuitry is included to allow the number and peak values of the emphasized signal components to be selectively variable.

In accordance with one embodiment of the presently claimed invention, an apparatus includes a signal peaking circuit for selectively increasing high frequency components of a digital signal including an input signal terminal, signal peaking circuitry and signal combining circuitry. The input signal terminal conveys an input signal with a plurality of lower frequency signal components and a plurality of higher frequency signal components. The signal peaking circuitry, coupled to the input signal terminal, receives the input signal and selectively emphasizes the plurality of higher frequency signal components over the plurality of lower frequency signal components to provide an emphasized signal. The signal combining circuitry, coupled to the input signal terminal and the signal peaking circuitry, receives and selectively combines the input signal and the emphasized signal to provide a plurality of output signals, wherein each one of the plurality of output signals corresponds to the input signal and includes a respective selected portion of the plurality of higher frequency signal components emphasized over the plurality of lower frequency signal components and a respective selected peak signal value.

In accordance with another embodiment of the presently claimed invention, an apparatus includes a signal peaking circuit for selectively increasing high frequency components of a digital signal including input signal means, signal peaking means and signal combiner means. The input signal means is for conveying an input signal with a plurality of lower frequency signal components and a plurality of higher frequency signal components. The signal peaking means is for receiving the input signal and selectively emphasizing the plurality of higher frequency signal components over the plurality of lower frequency signal components and providing an emphasized signal. The signal combining means is for receiving and selectively combining the input signal and the emphasized signal and providing a plurality of output signals, wherein each one of the plurality of output signals corresponds to the input signal and includes a respective selected portion of the plurality of higher frequency signal components emphasized over the plurality of lower frequency signal components and a respective selected peak signal value.

In accordance with still another embodiment of the presently claimed invention, a signal peaking method for selectively increasing high frequency components of a digital signal includes:

receiving an input signal with a plurality of lower frequency signal components and a plurality of higher frequency signal components;

processing said input signal by selectively emphasizing the plurality of higher frequency signal components over the plurality of lower frequency signal components and providing an emphasized signal; and selectively combining the input signal and the second filtered signal and providing a plurality of output signals, wherein each one of the plurality of output signals corresponds to the input signal and includes a respective selected portion of the plurality of higher frequency signal components emphasized over the plurality of lower frequency signal components and a respective selected peak signal value.

DETAILED DESCRIPTION OF THE INVENTION

The following detailed description is of example embodiments of the.presently claimed invention with references to the accompanying drawings. Such description is intended to be illustrative and not limiting with respect to the scope of the present invention. Such embodiments are described insufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are coupled together to provide the described function. Additionally, the term "signal" may refer to one or more currents, one or more voltages, or a data signal. Within the drawings, like or related elements will have like or related alpha, numeric or alphanumeric designators.

Figure 1:
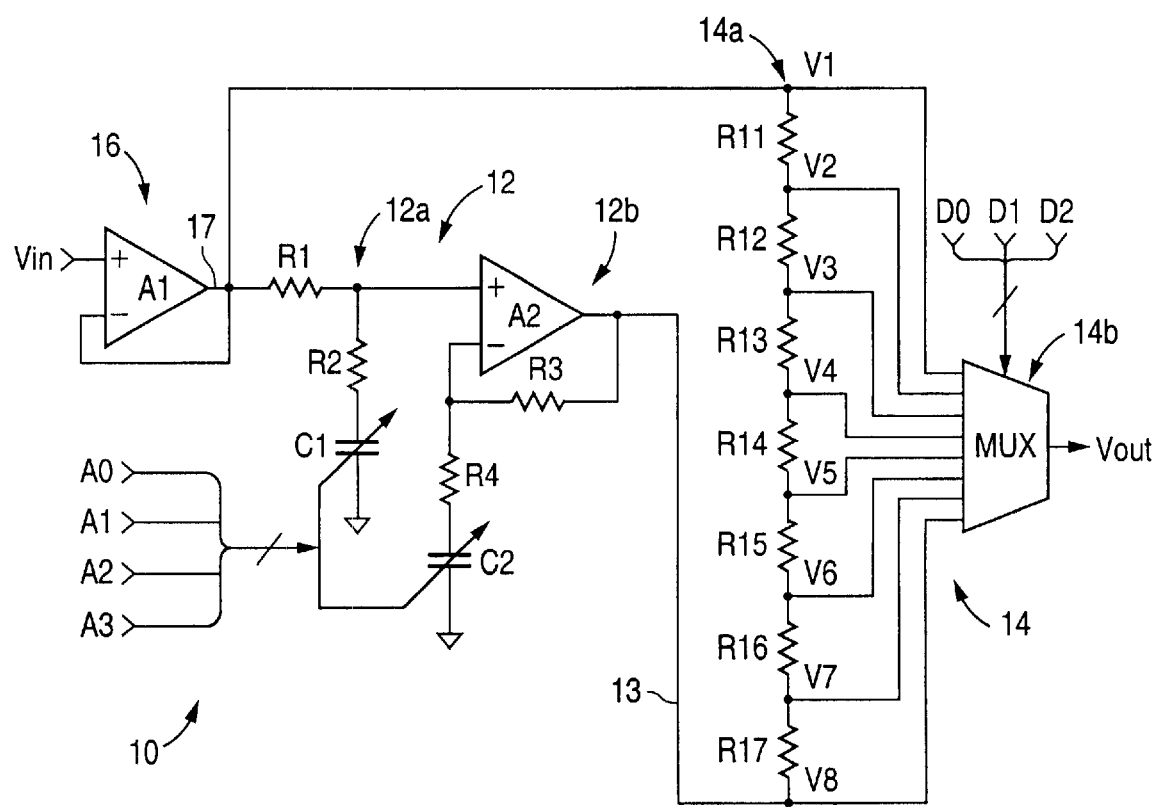
FIG. 1 is schematic diagram of a signal peaking circuit in accordance with one embodiment of the present invention.

Referring to FIG. 1, a signal peaking circuit 10 in accordance with one embodiment of the present invention includes frequency emphasis circuitry 12 and signal combining and selection circuitry 14. Additionally, buffer circuitry 16 may be included for buffering and providing isolation for the input signal.

In this particular embodiment 10, the input signal Vin is buffered by an amplifier A1 in the form of a voltage follower amplifier circuit, which is well known in the art. The buffered signal 17 is processed by the frequency emphasis circuit 12 to produce an emphasized, or filtered, signal 13 (discussed in more detail below). The buffered signal 17 and emphasized signal 13 are then processed in the signal combining and selection circuitry 14 (discussed in more detail below) to produce the output signal Vout.

Figure 2:
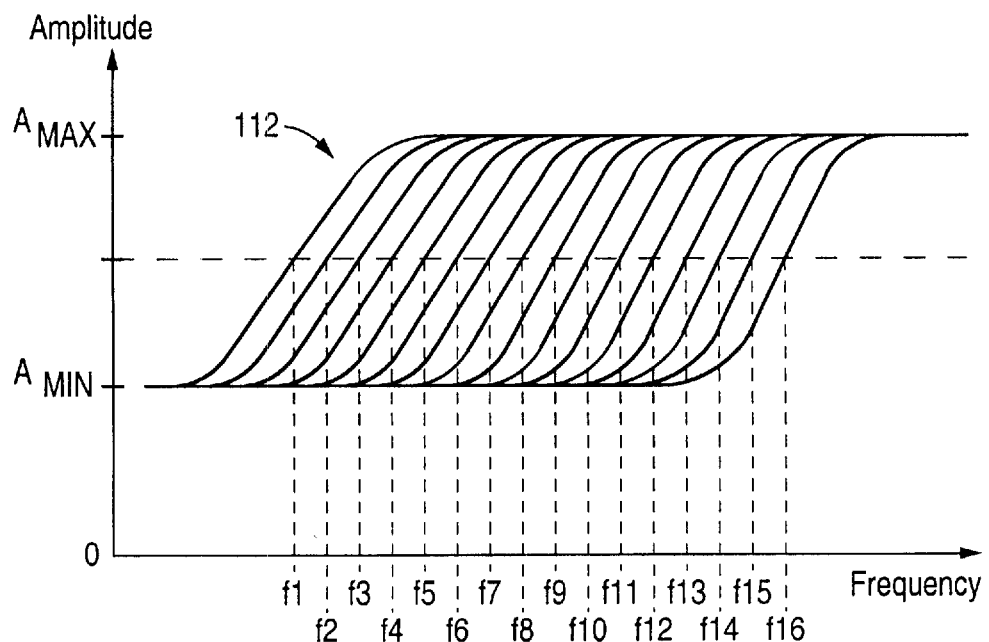
FIG. 2 is a graph of a variable frequency response characteristic representing the performance of the circuit of FIG. 1.

The frequency emphasis circuitry 12 has an overall high pass transfer characteristic that emphasizes higher frequency signal components over lower frequency signal components of the incoming signal 17. With reference to FIG. 2, though not necessarily drawn to scale, the family of curves 112 as depicted illustrate qualitatively the overall frequency response characteristic of the frequency emphasis circuitry 12. For example, if it is desired to emphasize the frequent signal components having frequencies greater than frequency f8, then the digital control signals A3, A2, A1, A0 are set to cause the adjustable capacitances C1, C2 to provide the appropriate corresponding frequency response for the circuitry 12. However, if it is desired to emphasize those signal frequencies above frequency f14 instead, then appropriate adjustments to the digital control signals A3, A2, A1, A0 are made.

In this particular embodiment, the frequency emphasis circuitry 12 includes low pass circuitry 12a and high pass circuitry 12b. Low pass circuitry 12a includes an in-line, or serial, resistor R1 and a shunt impedance that includes series-connected resistor R2 and adjustable capacitor C1 (discussed in more detail below).

High pass circuitry 12b includes a differential amplifier A2 (e.g., an operational amplifier), a feedback resistor R3 and a shunt impedance that includes series-connected resistor R4 and adjustable capacitor C2 (discussed in more detail below).

The high pass circuitry 12b is the dominant portion of the frequency emphasis circuitry 12 in that it provides emphasis of the higher frequency signal components, most of which is reflected in the overall transfer characteristic of the circuitry 12. The low pass circuitry 12a emphasizes the lower frequency signal components relative to those signal components emphasized by the high pass circuitry 12b. Such low frequency emphasis, however, is less than that emphasis of the higher frequency signal components provided by the high pass circuitry 12b. The primary reason for including the low pass circuitry 12a is to compensate for the signal phase characteristics introduced by the high pass circuitry 12b. Nonetheless, it will be understood that the frequency emphasis circuitry 12 need not necessarily include low pass circuitry to perform in accordance with the presently claimed invention, depending upon the desired phase characteristics of the overall frequency emphasis circuitry 12.

The buffered signal 17 and frequency emphasized signal 13 are applied to signal combining circuitry 14a in the form of a resistive ladder composed of series-connected resistors R11, R12, R13, R14, R15, R16, R17. As a result, these signals 17, 13 are linearly summed to produce multiple signal voltages V1, V2, V3, V4, V5, V6, V7, V8. These voltages V1–V8 are then processed by signal selection circuitry 14b. Such signal selection circuitry 14b may be a multiplexor or a plurality of signal switches (discussed in more detail below) and selects one of the input signals V1–V8 in accordance with digital control signals D2, D1, D0 to provide the output signal Vout.

The control signals A3–A0 that control the frequency characteristics of the frequency emphasis circuitry 12 (where A0 is the least significant bit and A3 is the most significant bit) determine the number of emphasized higher frequency signal components. For example, with reference to FIG. 2, these control signals A3–A0 determine the frequency f1–f16 above which such signal frequencies are to be emphasized or boosted.

Control signals D2–D0 determine which of the input signals V1–V8 is to be selected as the output signal Vout. Each one of these selected signals V1–V8 corresponds to the input signal Vin with each signal V1–V8 having a respective selected portion of the higher frequency signal components emphasized over the lower frequency signal components, and a respective peak signal value (discussed in more detail below).

Figure 3:
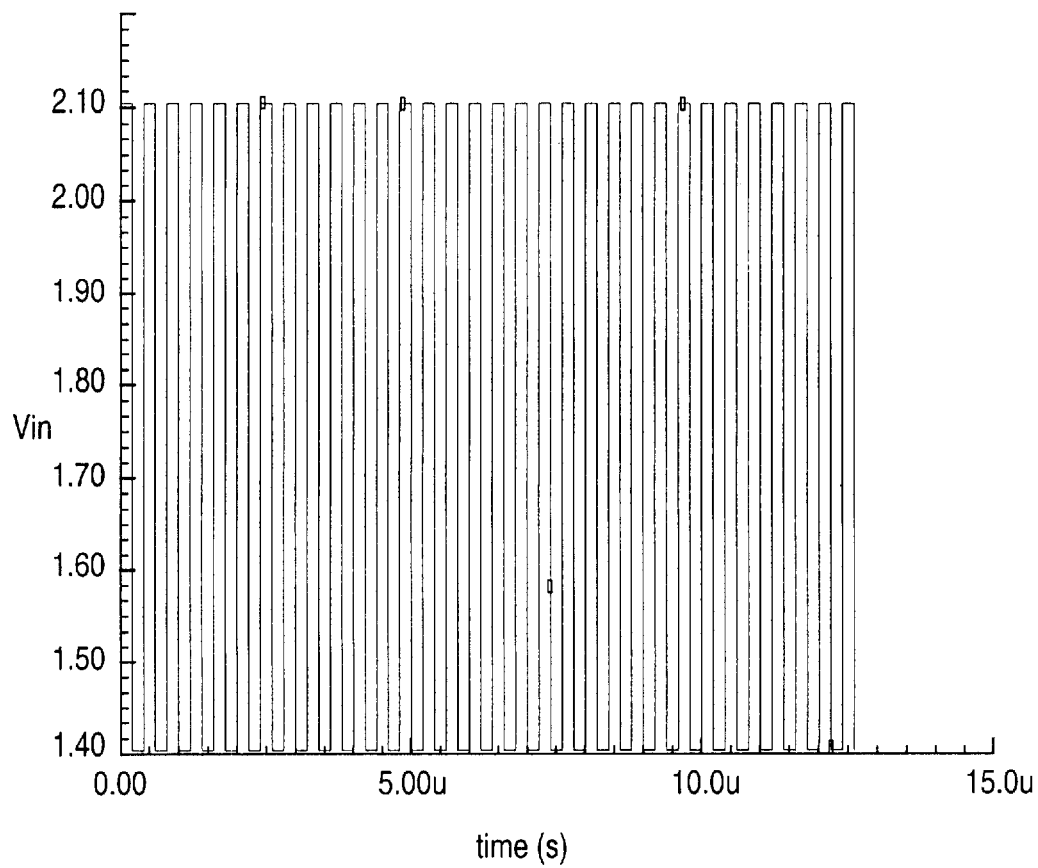
FIG. 3 is a signal timing diagram of a digital input signal used to test the performance characteristics of the circuit of FIG. 1.

Referring to FIG. 3, the signal peaking characteristics provided by the circuit 10 of FIG. 1 can perhaps be best illustrated by observing the pulse response characteristics. This can be done by applying an input signal Vin in the form of a periodic pulse, e.g., rectangular wave, such as that depicted in FIG. 3.

Figure 4:
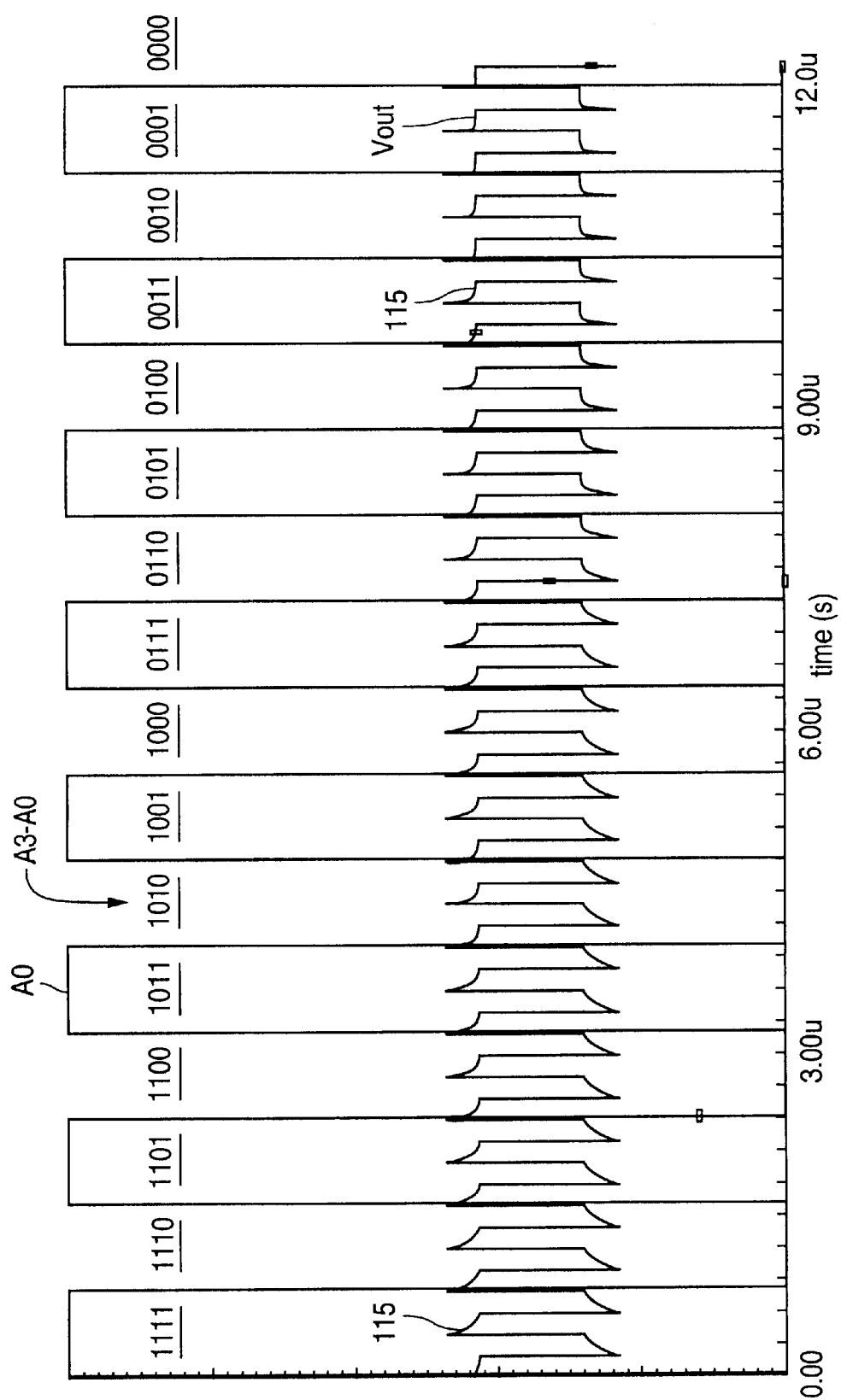
FIG. 4 is a signal timing diagram illustrating the variable frequency response characteristic of the circuit of FIG. 1 with the signal of FIG. 3 applied.

Referring to FIG. 4, with such a signal (FIG. 3) applied as the input signal Vin the output signal Vout will have a signal shape that depends upon how many higher frequency signal components are emphasized, which is determined by the frequency response control signals A3–A0. FIG. 4 illustrates the resulting signal wave form for the output signal Vout as the frequency response control signals A3–A0 are adjusted over their full binary range from maximum 1111 to minimum 0000. Also shown for reference purposes only is a waveform corresponding to the alternating state of the least significant bit A0 during such adjustment. As can be seen, as the frequency response control signals A3–A0 are adjusted from their maximum value 1111, corresponding to the maximum number of higher frequency signal components being emphasized (e.g., frequency f1 in FIG. 2), to their minimum value 0000, corresponding to the minimum number of higher frequency signal components being emphasized (e.g., frequency f16 in FIG. 2), the decay time of the overshoot 115 decreases.

Figure 5:
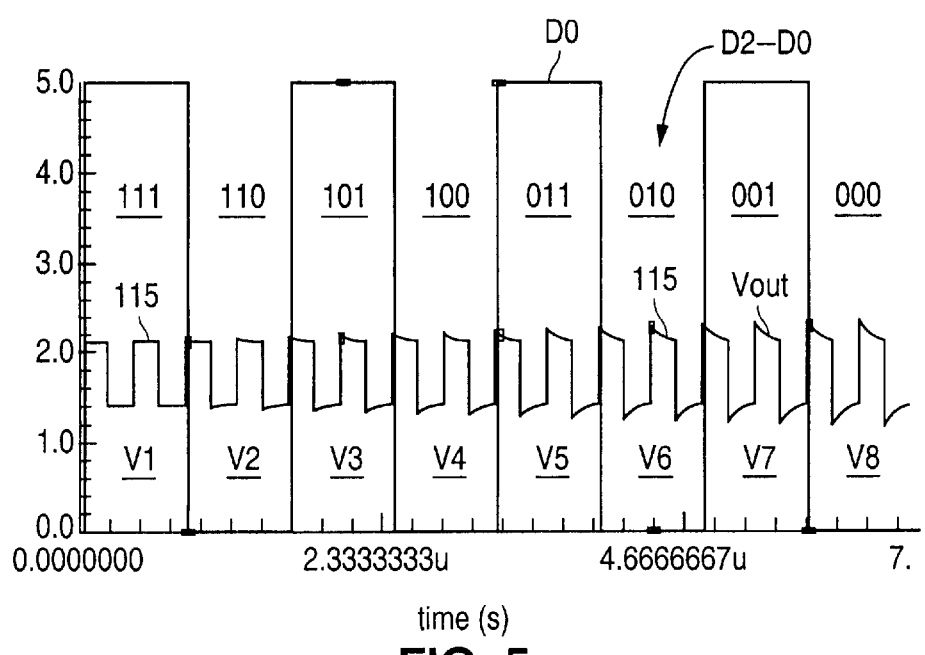
FIG. 5 is a signal timing diagram illustrating the variable peak signal values of the output signal of FIG. 1 with the input signal of FIG. 3 applied.

Referring to FIG. 5, the signal selection control signals D2–D0 determine which of the signals V1–V8 available from the signal combining circuitry 14a is selected to be the output signal Vout. As can be seen, as these signal selection control signals D2–D0 change from their maximum binary value 111, corresponding to selection of signal V1, to their minimum binary value 000, corresponding to selection of signal V8, the peak value 115 of the overshoot varies from minimum to maximum, respectively. For example, where signal selection control signals D2–D0 are set at 110, signal V2 is selected as the output signal Vout. When the signal selection control signals D2–D0 are set at 010, signal V6 is selected, thereby causing the output signal Vout to have a higher peak overshoot value 115 since signal V6 includes more of the emphasized signal 13 than the non-emphasized signal 17.

Figure 6:
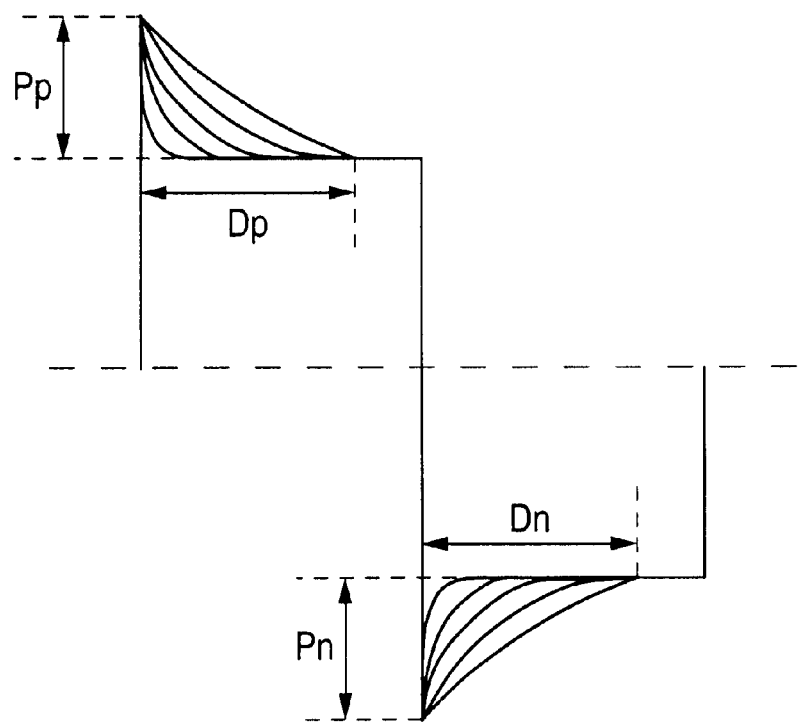
FIG. 6 illustrates the variable pulse response of the circuit of FIG. 1 in terms of the peak signal values and variable decay time.

Referring to FIG. 6, the effects of the control signals A3–A0, D2–D0 can be summarized as follows. In the case of an input Vin in the form of a pulsed signal, such as that shown in FIG. 3, the frequency response control signals A3–A0 determine the decay time Dp, Dn of the overshoots of the positive and negative pulses. The signal selection control signals D2–D0 determine the peak values Pp, Pn of the overshoots of the positive and negative pulses.

Figure 7:
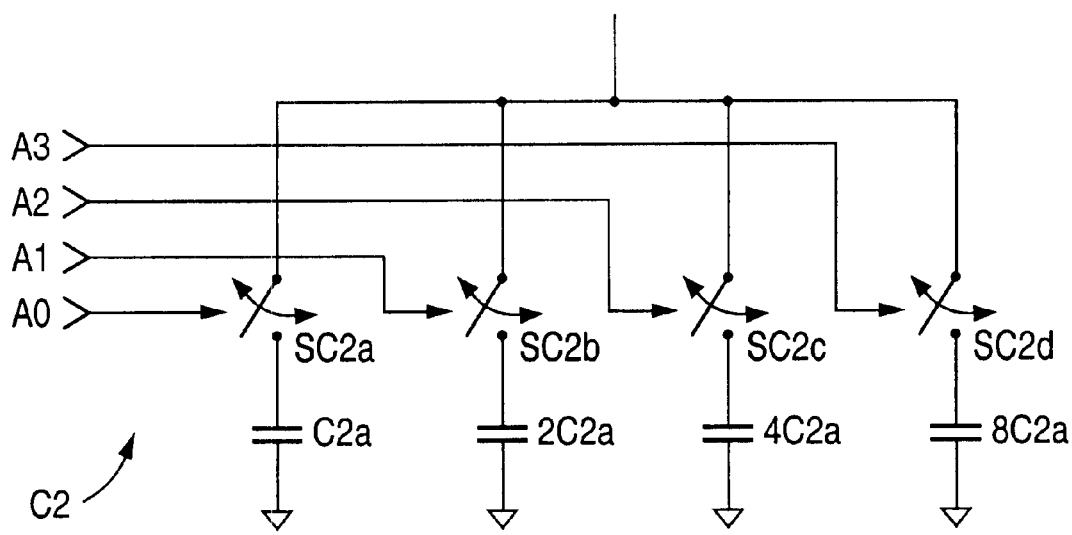
FIG. 7 is a schematic diagram of an example embodiment of the adjustable capacitors of the circuit of FIG. 1.

Referring to FIG. 7, an example embodiment of one of the adjustable capacitors (e.g., capacitor C2 in the frequency emphasis circuitry 12 of FIG. 1) can be implemented as a number of series-connected capacitors and switches, all of which are connected in parallel as shown. Due to the binary nature of the frequency response control signals A3–A0, the capacitance values should be binary-weighted as well. Hence, the capacitor controlled by the least significant bit A0 will have a value of C2a, while the capacitor value controlled by the most significant bit A3 will have a value of 8*C2a. These capacitances C2A, 2*C2A, 4*C2A, 8*C2A are switched into or out of the overall circuitry in accordance with the control signals A3–A0 which control the switches SC2a, SC2b, SC2c, SC2d.

Figure 8:
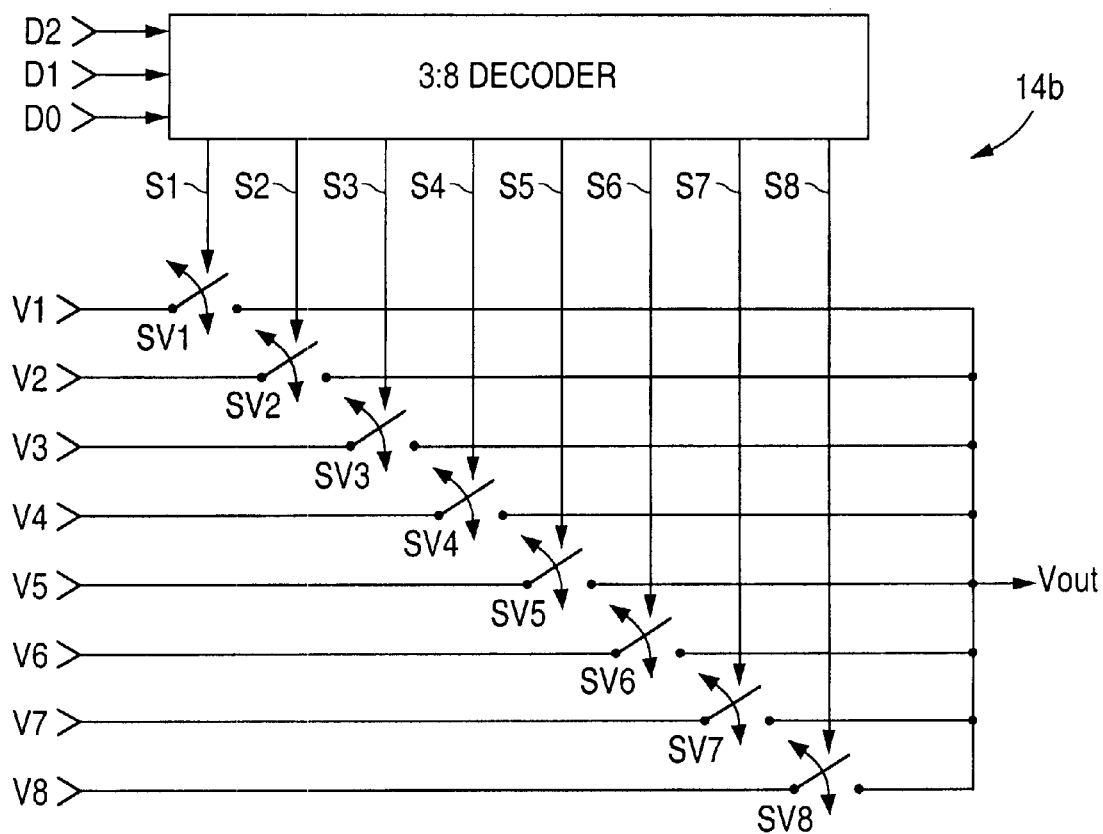
FIG. 8 is a schematic diagram of an example embodiment of the output signal multiplexor of the circuit of FIG. 1.

Referring to FIG. 8, an example embodiment of the signal selection circuitry 14b (FIG. 1) can be implemented as a switches SV1, SV2, SV3, SV4, SV5, SV6, SV7, SV8 controlled by a 3-to-8 (3:8) decoder circuit (which is well known in the art). The selection control signals D2–D0 are decoded by the decoder to assert and de-assert the appropriate switch control signals S1, S2, S3, S4, S5, S6, S7, S8 to close or open the corresponding switches SV1, SV2, SV3, SV4, SV5, SV6, SV7, SV8.

Figure 9:
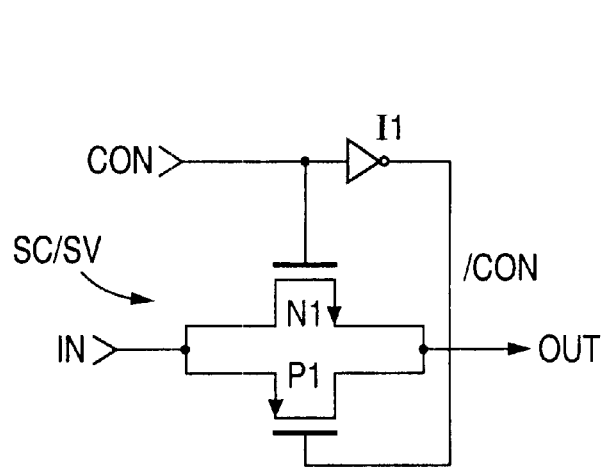
FIG. 9 is a schematic diagram of an example embodiment of the signal switches of the circuits of FIGS. 7 and 8.

Referring to FIG. 9, an example embodiment of an electronic switch suitable for use as the switches in the circuits of FIGS. 7 and 8 can be implemented in the form of a transmission gate. As is well known in the art, an NMOS transistor and a PMOS transistor are connected drain-to-source and source-to-drain, respectively. There gate terminals are driven by a control signal CON and its inverse/CON (provided by invertor I1) thereby causing the input signal IN to either be passed or not passed through as the output signal OUT. As will also be understood, such switches SC/SV can alternatively be implemented as a simple pass transistor instead.

Figure 10:
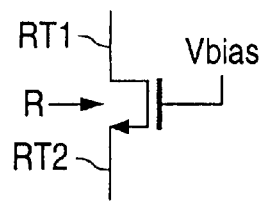
FIG. 10 is a schematic diagram of an integrated circuit implementation for a resistor.

Referring to FIG. 10, as is well known in the art, when implementing a circuit in accordance with the presently claimed invention in integrated circuit form, resistors can be implemented as a MOS transistor having suitable channel length and width dimensions and doping profiles, with an appropriate V bias voltage applied at the gate terminal. Accordingly, an appropriate resistance value can be established between the drain and source terminals which serve as resistor terminals RT1 and RT2, respectively.

Figure 11:
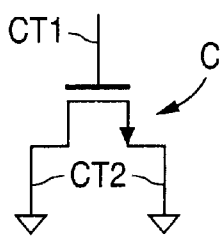
FIG. 11 is a schematic diagram of an integrated circuit implementation of a capacitor.

Similarly, referring to FIG. 11, a capacitor C can be implemented in integrated circuit form with a MOS transistor having its drain and source terminals connected, e.g., to circuit ground. Accordingly, the gate and mutually connected drain and source terminals serve as capacitor terminals CT1 and CT2, respectively. As is well known in the art, the area of the gate terminal and the dielectric insulating the gate terminal from the channel can be designed to provide the appropriate value of capacitance.

Figure 12:
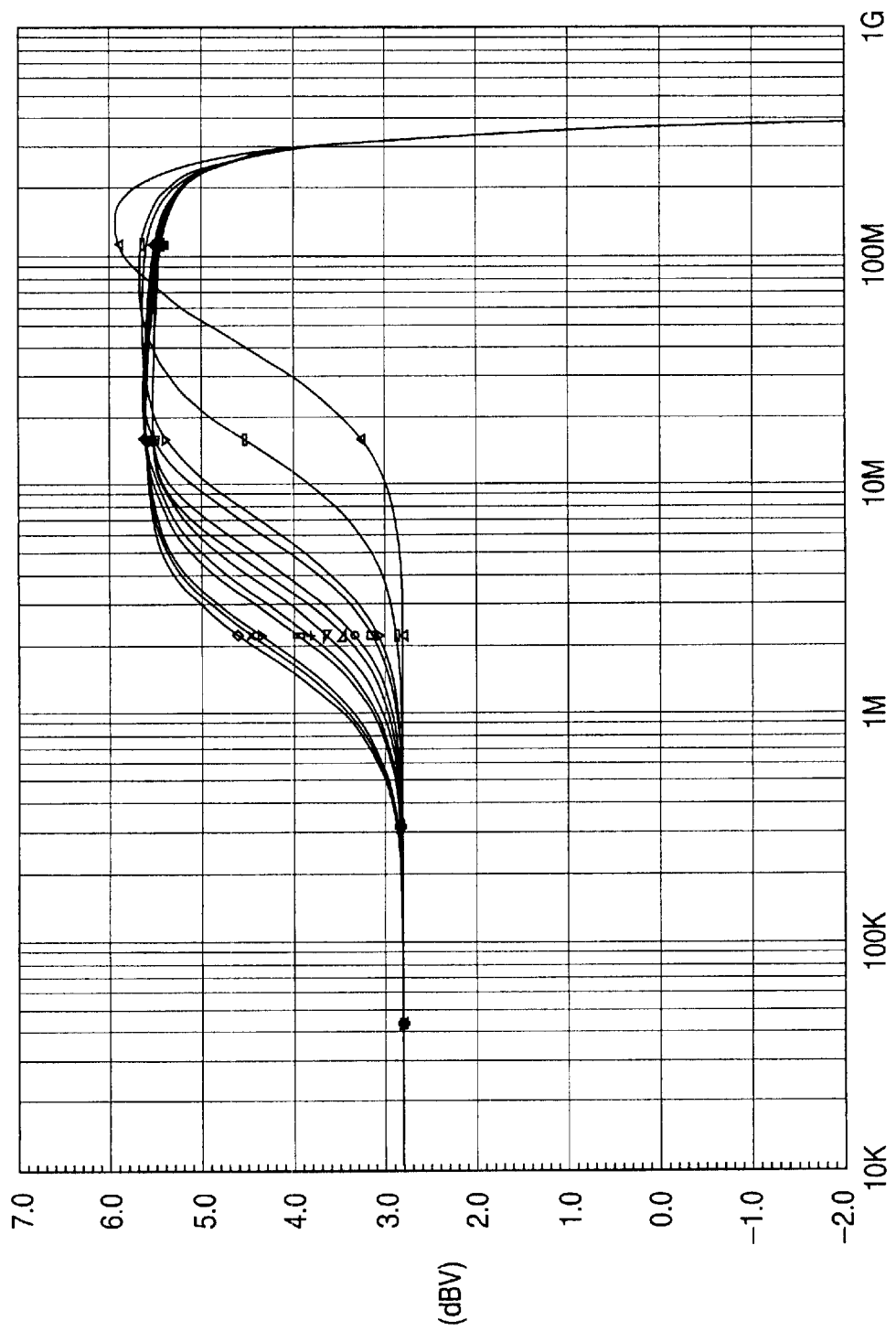
FIG. 12 is a graph of the frequency response of a simulation of circuitry in accordance with the presently claimed invention over the range of values for the peaking frequency control signals at a selected fixed peaking amplitude.

Referring to FIG. 12, the frequency response of a simulation of circuitry in accordance with the presently claimed invention over the range of values for the peaking frequency control signals at a selected fixed peaking amplitude would appear as shown. As shown, as the frequency response control signals A3–A0 are adjusted over their full binary range, the frequency at which signal peaking begins varies as well.

Figure 13:
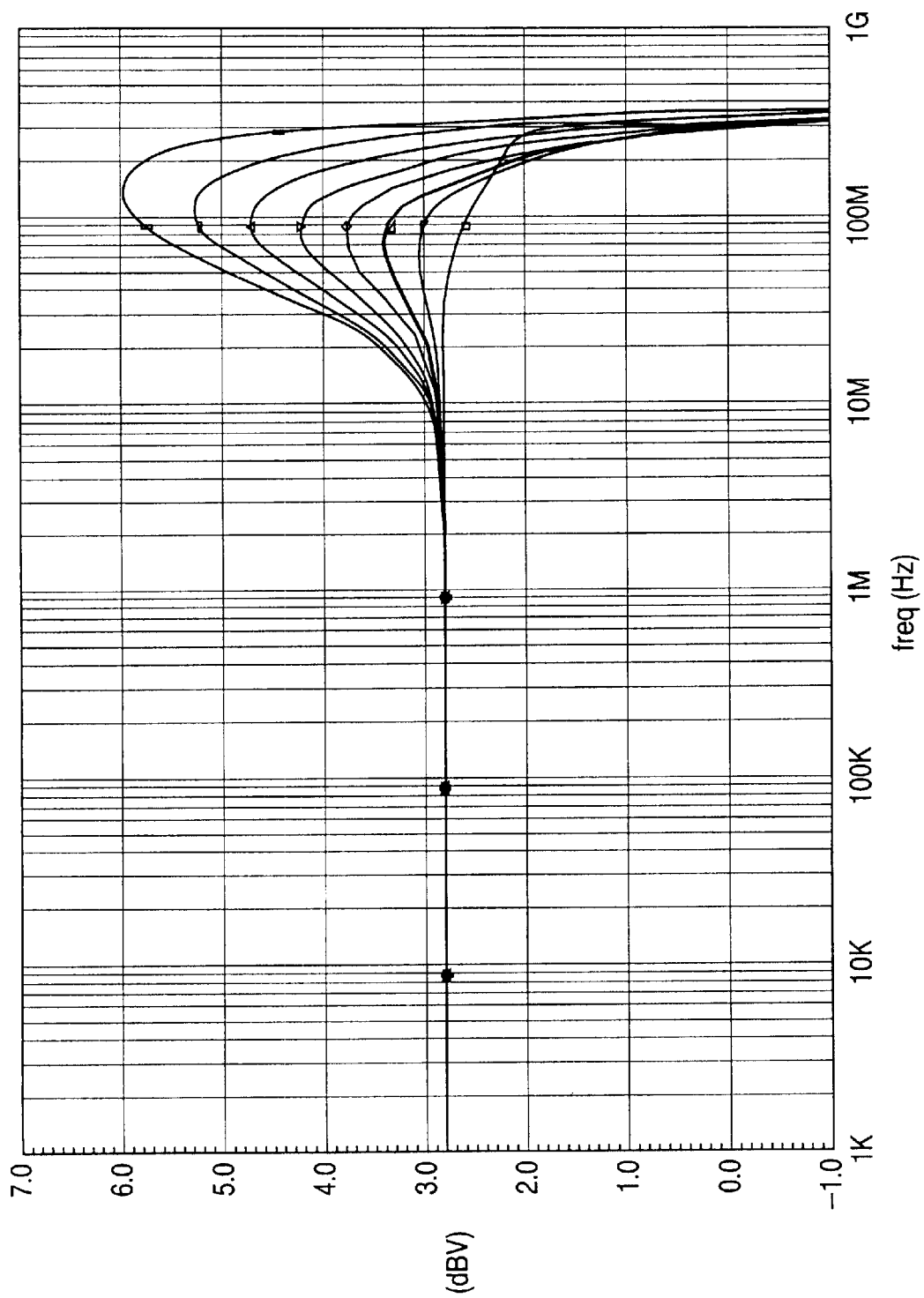
FIG. 13 is a graph of the frequency response of a simulation of circuitry in accordance with the presently claimed invention over the range of values for the peaking amplitude control signals at a selected fixed peaking frequency.

Referring to FIG. 13, the frequency response of a simulation of circuitry in accordance with the presently claimed invention over the range of values for the peaking amplitude control signals at a selected fixed peaking frequency would appear as shown. As shown, as the signal selection control signals D2–D0 are adjusted over their full binary range, the maximum peaking amplitude varies as well. Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a signal peaking circuit for selectively increasing high frequency components of a signal, comprising:

an input signal terminal that conveys an input signal with a plurality of lower frequency signal components and a plurality of higher frequency signal components;

signal peaking circuitry, coupled to said input signal terminal, that receives said input signal and selectively emphasizes said plurality of higher frequency signal components over said plurality of lower frequency signal components to provide an emphasized signal; and signal combining circuitry, coupled to said input signal terminal and said signal peaking circuitry, that receives and combines said input signal and said emphasized signal to provide a plurality of distinct output signals, wherein each one of said plurality of output signals corresponds to said input signal and includes a respective selected portion of said plurality of higher frequency signal components emphasized over said plurality of lower frequency signal components and a respective selected peak signal value.

2. The apparatus of claim 1, wherein said signal peaking circuitry comprises:

low pass circuitry, coupled to said input signal terminal, that receives said input signal and selectively emphasizes a portion of said plurality of lower frequency signal components over said plurality of higher frequency signal components to provide an intermediate signal; and high pass circuitry, coupled to said low pass circuitry, that receives said intermediate signal and selectively emphasizes a portion of said plurality of higher frequency signal components over said plurality of lower frequency signal components to provide said emphasized signal.

3. The apparatus of claim 2, wherein said low pass circuitry comprises:

resistive circuitry, coupled between said input signal terminal and said high pass circuitry; and shunt capacitive circuitry, coupled to said resistive circuitry.

4. The apparatus of claim 3, wherein said shunt capacitive circuitry comprises a plurality of switched capacitive circuits mutually coupled in parallel.

5. The apparatus of claim 2, wherein said high pass circuitry comprises:

amplification circuitry, coupled between said low pass circuitry and said signal combining circuitry;

resistive circuitry, coupled to said amplification circuitry and said signal combining circuitry; and shunt capacitive circuitry, coupled to said amplification circuitry and said resistive circuitry.

6. The apparatus of claim 5, wherein said shunt capacitive circuitry comprises a plurality of switched capacitive circuits mutually coupled in parallel.

7. The apparatus of claim 1, wherein said signal combining circuitry comprises a plurality of resistive circuit elements.

8. The apparatus of claim 1, further comprising signal selection circuitry, coupled to said signal combining circuitry, that receives at least one selection control signal and in response thereto selects among said plurality of output signals to provide a selected output signal.

9. The apparatus of claim 1, further comprising a plurality of control signal terminals, coupled to said low pass circuitry and said high pass circuitry, that conveys a plurality of frequency emphasis control signals.

10. The apparatus of claim 9, wherein said low pass circuitry and said high pass circuitry emphasize said portions of said pluralities of lower and higher frequency signal components, respectively, in response to said plurality of frequency emphasis control signals.

11. An apparatus including a signal peaking circuit for selectively increasing high frequency components of a signal, comprising:

an input signal terminal that conveys an input signal with a plurality of lower frequency signal components and a plurality of higher frequency signal components;

signal peaking circuitry, coupled to said input signal terminal, that receives said input signal and selectively emphasizes said plurality of higher frequency signal components over said plurality of lower frequency signal components to provide an emphasized signal;

signal combining circuitry, coupled to said input signal terminal and said signal peaking circuitry, that receives and combines said input signal and said emphasized signal to provide a plurality of output signals, wherein each one of said plurality of output signals corresponds to said input signal and includes a respective selected portion of said plurality of higher frequency signal components emphasized over said plurality of lower frequency signal components and a respective selected peak signal value; and signal selection circuitry, coupled to said signal combining circuitry, that receives at least one selection control signal and in response thereto selects among said plurality of output signals to provide a selected output signal, comprising
a plurality of circuit switches, coupled to said signal combining circuitry, that receives a plurality of decoded signals and in response thereto switches said plurality of output signals to provide said selected output signal, and
decoding circuitry, coupled to said plurality of circuit switches, that receives said at least one selection control signal and in response thereto provides said plurality of decoded signals.

12. An apparatus including a signal peaking circuit for selectively increasing high frequency components of a signal, comprising:

an input signal terminal that conveys an input signal with a plurality of lower frequency signal components and a plurality of higher frequency signal components;

signal peaking circuitry, coupled to said input signal terminal, that receives said input signal and selectively emphasizes said plurality of higher frequency signal components over said plurality of lower frequency signal components to provide an emphasized signal;

signal combining circuitry, coupled to said input signal terminal and said signal peaking circuitry, that receives and combines said input signal and said emphasized signal to provide a plurality of output signals, wherein each one of said plurality of output signals corresponds to said input signal and includes a respective selected portion of said plurality of higher frequency signal components emphasized over said plurality of lower frequency signal components and a respective selected peak signal value; and signal selection circuitry, coupled to said signal combining circuitry, that receives at least one selection control signal and in response thereto selects among said plurality of output signals to provide a selected output signal, comprising multiplexing circuitry that receives a plurality of multiplex control signals as said at least one selection control signal and in response thereto multiplexes said plurality of output signals to provide said selected output signal.

13. An apparatus including a signal peaking circuit for selectively increasing high frequency components of a digital signal, comprising:

input signal means for conveying an input signal with a plurality of lower frequency signal components and a plurality of higher frequency signal components;

signal peaking means for receiving said input signal and selectively emphasizing said plurality of higher frequency signal components over said plurality of lower frequency signal components and providing an emphasized signal; and signal combining means for receiving and combining said input signal and said emphasized signal and providing a plurality of distinct output signals, wherein each one of said plurality of output signals corresponds to said input signal and includes a respective selected portion of said plurality of higher frequency signal components emphasized over said plurality of lower frequency signal components and a respective selected peak signal value.

14. The apparatus of claim 13, wherein said signal peaking means comprises:

low pass signal means for receiving said input signal and selectively emphasizing a portion of said plurality of lower frequency signal components over said plurality of higher frequency signal components and providing an intermediate signal; and high pass signal means for receiving said intermediate signal and selectively emphasizing a portion of said plurality of higher frequency signal components over said plurality of lower frequency signal components and providing said emphasized signal.

15. The apparatus of claim 13, further comprising signal selector means for receiving at least one selection control signal and in response thereto selecting among said plurality of output signals and providing a selected output signal.

16. The apparatus of claim 13, further comprising control signal means for conveying a plurality of frequency emphasis control signals.

17. A signal peaking method for selectively increasing high frequency components of a digital signal, comprising:

receiving an input signal with a plurality of lower frequency signal components and a plurality of higher frequency signal components;

processing said input signal by selectively emphasizing said plurality of higher frequency signal components over said plurality of lower frequency signal components and providing an emphasized signal; and combining said input signal and said second filtered signal and providing a plurality of distinct output signals, wherein each one of said plurality of output signals corresponds to said input signal and includes a respective selected portion of said plurality of higher frequency signal components emphasized over said plurality of lower frequency signal components and a respective selected peak signal value.

18. The method of claim 17, wherein said processing of said input signal comprises:

processing said input signal by selectively emphasizing a portion of said plurality of lower frequency signal components over said plurality of higher frequency signal components and providing an intermediate signal; and processing said intermediate signal by selectively emphasizing a portion of said plurality of higher frequency signal components over said plurality of lower frequency signal components and providing said emphasized signal.

19. The method of claim 17, further comprising receiving at least one selection control signal and in response thereto selecting among said plurality of output signals and providing a selected output signal.

20. The method of claim 17, further comprising receiving a plurality of frequency emphasis control signals and in response thereto emphasizing said portions of said pluralities of lower and higher frequency signal components.

* * * * *

UNITED STATES PATENT AND TRADEMARK OFFICE
CERTIFICATE OF CORRECTION

PATENT NO. : 6,593,804 B1
DATED : July 15, 2003
INVENTOR(S) : Peyman Hojabri

It is certified that error appears in the above-identified patent and that said Letters Patent is hereby corrected as shown below:

<u>Column 7,</u>
Lines 59-62, please replace claim 9 with the following:
9. An apparatus including a signal peaking circuit for selectively increasing high frequency components of a signal, comprising:

an input signal terminal that conveys an input signal with a plurality of lower frequency signal components and a plurality of higher frequency signal components;

signal peaking circuitry, coupled to said input signal terminal, that receives said input signal and selectively emphasizes said plurality of higher frequency signal components over said plurality of lower frequency signal components to provide an emphasized signal;

signal combining circuitry, coupled to said input signal terminal and said signal peaking circuitry, that receives and combines said input signal and said emphasized signal to provide a plurality of output signals, wherein each one of said plurality of output signals corresponds to said input signal and includes a respective selected portion of said plurality of higher frequency signal components emphasized over said plurality of lower frequency signal components and a respective selected peak signal value; and signal selection circuitry, coupled to said signal combining circuitry, that receives at least one selection control signal and in response thereto selects among said plurality of output signals to provide a selected output signal, comprising:

plurality of circuit switches, coupled to said signal combining circuitry, that receives a plurality of decoded signals and in response thereto switches said plurality of output signals to provide said selected output signal, and decoding circuitry, coupled to said plurality of circuit switches, that receives said at least one selection control signal and in response thereto provides said plurality of decoding signals.

Lines 63-67, please replace claim 10 with the following:
10. An apparatus including a signal peaking circuit for selectively increasing high frequency components of a signal comprising:

an input signal terminal that conveys an input signal with a plurality of lower frequency signal components and a plurality of higher frequency signal components;

UNITED STATES PATENT AND TRADEMARK OFFICE
CERTIFICATE OF CORRECTION

PATENT NO. : 6,593,804 B1
DATED : July 15, 2003
INVENTOR(S) : Peyman Hojabri

It is certified that error appears in the above-identified patent and that said Letters Patent is hereby corrected as shown below:

Column 7 (cont'd),
   signal peaking circuitry, coupled to said input signal terminal, that receives said input signal and selectively emphasizes said plurality of higher frequency signal components over said plurality of lower frequency signal components to provide an emphasized signal;

signal combining circuitry, coupled to said input signal terminal and said signal peaking circuitry, that receives and combines said input signal and said emphasized signal to provide a plurality of output signals, wherein each one of said plurality of output signals corresponds to said input signal and includes a respective selected portion of said plurality of higher frequency signal components emphasized over said plurality of lower frequency signal components and a respective selected peak signal value; and signal selection circuitry, coupled to said signal combining circuitry, that receives at least one selection control signal and in response thereto selects among said plurality of output signals to provide a selected output signal, comprising multiplexing circuitry that receives a plurality of multiplex control signals as said at least one selection control signal and in response thereto multiplexes said plurality of output signals to provide said selected output signal.

Column 8,
Lines 1-34, please replace claim 11 with the following:
11. The apparatus of claim 1, further comprising a plurality of control signal terminals, coupled to said low pass circuitry and said high pass circuitry, that conveys a plurality of frequency emphasis control signals.

UNITED STATES PATENT AND TRADEMARK OFFICE
CERTIFICATE OF CORRECTION

PATENT NO. : 6,593,804 B1
DATED : July 15, 2003
INVENTOR(S) : Peyman Hojabri

It is certified that error appears in the above-identified patent and that said Letters Patent is hereby corrected as shown below:

<u>Column 8,</u>
Lines 35-64, please replace claim 12 with the following:
12. The apparatus of claim 11, wherein said low pass circuitry and said high pass circuitry emphasize said portions of said pluralities of lower and higher frequency signal components, respectively, in response to said plurality of frequency emphasis control signals.

Signed and Sealed this

Twenty-first Day of October, 2003

JAMES E. ROGAN
*Director of the United States Patent and Trademark Office*